(12) United States Patent
Zamprogno et al.

(10) Patent No.: US 7,795,947 B2
(45) Date of Patent: Sep. 14, 2010

(54) BUFFER DEVICE FOR SWITCHED CAPACITANCE CIRCUIT

(75) Inventors: Marco Zamprogno, Cesano Maderno (IT); Germano Nicollini, Piacenza (IT); Alberto Minuti, Caorso (IT)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 12/391,574

(22) Filed: Feb. 24, 2009

(65) Prior Publication Data

US 2009/0212830 A1 Aug. 27, 2009

Related U.S. Application Data

(63) Continuation-in-part of application No. PCT/IT2006/000628, filed on Aug. 25, 2006.

(51) Int. Cl.
 *G06F 7/64* (2006.01)
(52) U.S. Cl. ............................. 327/337; 327/91; 330/9
(58) Field of Classification Search ................ None
 See application file for complete search history.

(56) References Cited

U.S. PATENT DOCUMENTS

| | | | |
|---|---|---|---|
| 4,403,195 A | 9/1983 | Wurzburg | |
| 4,543,534 A * | 9/1985 | Temes et al. | 330/9 |
| 4,942,367 A * | 7/1990 | Milkovic | 330/9 |
| 5,923,206 A | 7/1999 | Levinson | |
| 6,778,121 B2 * | 8/2004 | Manganaro | 341/150 |

FOREIGN PATENT DOCUMENTS

| | | |
|---|---|---|
| EP | 0028961 A1 | 5/1981 |
| WO | 03007479 A1 | 1/2003 |

* cited by examiner

*Primary Examiner*—An T Luu
(74) *Attorney, Agent, or Firm*—E. Russell Tarleton; Seed IP Law Group PLLC

(57) ABSTRACT

An integrated buffer device for a switched capacitance circuit having a buffer with an output for an output voltage dependent upon an input voltage that can be supplied by a source to the buffer device; a capacitive switching component that can be switched between a first and second condition and connected, respectively, to the source and to the buffer to transfer the input voltage onto the output; the capacitive switching component provided with a terminal having an associated stray capacitance; a charging and discharging device configured to pre-charge the stray capacitance at a reference voltage before taking up the second condition and to pre-discharge the stray capacitance before taking up the first condition.

26 Claims, 5 Drawing Sheets

BUFFER DEVICE FOR SWITCHED CAPACITANCE CIRCUIT

BACKGROUND

1. Technical Field

The present disclosure refers to a buffer device to be placed between a switched capacitance user circuit and a source of an input signal.

2. Description of the Related Art

For the purposes of the present disclosure, "switched capacitance" circuit shall mean a circuit that includes at least one capacitor and that during its operation can switch between different configurations in which the capacitor is connected to different terminals.

As an example and not limitingly, for the user circuit a SAR (Successive Approximation Register) charge sharing A/D converter, similar to the one described in patent application WO-A-2003-007479, is considered, which uses two arrays of capacitors each suitable for being charged to store the voltage signal to be sampled and to then provide an output comparator.

In such a known converter, the charging of the input voltage (single-ended) VIN is carried out directly in a suitable initial fraction of the overall conversion time. At the end of the sampling step the comparator is activated. From this point onwards the input voltage VIN is stored (differentially) on the capacitive arrays and the digital output code can then be determined according to the algorithm of the successive approximations. In order to carry out a correct sampling of the input signal, the asymptotic setting in the node VIN (and of the summation nodes of the arrays) must be ensured in the time assigned to the charging step.

A problem that arises in the design of converters of this type concerns the fact that the external source that supplies the voltage to be converted influences the sampling step and can in turn be significantly influenced by it.

A first problematic situation occurs when the external source has a very high equivalent (purely resistive) impedance. The constant charging time of the capacitive array is determined by the capacitance of the array itself, by the input impedance of the reset comparator, and by the equivalent impedance of the voltage to be converted.

As the conversion speed increases (and therefore as the time allocated to conversion decreases, with consequent more or less proportional reduction in the time allocated to charging the input signal) and as the resolution increases (which leads to an increase in the capacitance of the arrays) the equivalent resistance of the generator of the voltage to be converted can become the limiting factor in ensuring the correct asymptotic bond of the sampling step. At the least a gain error in the result of the conversion comes from this.

The problem of dependency of the conversion upon the equivalent model of the source is even more sensitive if one considers the (fairly frequent) case in which such a model can be described by a series resistance and by a capacitance to ground. When, at the start of the sampling step, the analogue-digital converter is connected to the input, there is a charge-sharing effect between the capacitance of the source and the capacitance of the converter. The input voltage of the converter is instantly perturbed. From this moment up to the end of the sampling step (when the voltage to be subsequently converted will be stored), the voltage at the input of the converter attempts to recover its asymptotic value with a constant time dependent upon the parameters mentioned previously, to which must be added the capacitance of the source. For sufficiently high resistance and capacitance values of the source, in the time assigned to the charging of the input signal, the voltage stored in the converter and the input voltage may not have reached their asymptotic value.

Often, the SAR analogue-digital converters are required to carry out measurement functions (General Purpose ADC). To limit the effects of the noise (of the converter itself and of the system), many successive measurements are made and the result is averaged. If the time that passes between two conversion requests is less than the time necessary for the input signal to recover its asymptotic value, the second conversion will sample a different signal to the one expected. The effect of such a situation is that of producing as a result of the average of the conversions, a value dependent upon the conversion request frequency, upon the number of conversions to be averaged, upon the values of the parameters of the equivalent model of the input signal, and upon the input equivalent of the converter itself.

It should also be kept in mind that the perturbation carried on the input signal could be particularly undesirable should such a signal also be used by other circuits (and not just be measured).

Therefore, the general application problem has been set of making a reader of a voltage signal capable of offering an equivalent impedance that is as ideal as possible (infinite resistance and zero switched capacitance).

A known solution is to make a (direct) voltage buffer with a closed loop operational amplifier. The buffer can always remain connected to the input signal offering an input capacitance that can be somewhat limited by adopting suitable architectures for the operational element.

This solution does nevertheless have some drawbacks, which can be clearly seen in the application considered previously. A first problem occurs in the case in which the analogue-digital converter must manage the conversion of many different input signals. In such a situation either many buffers are foreseen (one for each input) or else, by switching the input of the operational element from one signal to another, the capacitance equivalently seen in transition from the input is very high (also because such an operational element shall be designed with suitable offset and noise requirements) and dependent, through the polarization of the operational element, upon the voltage levels between which the switching of the input occurs.

Moreover, when there is an input range of the type [0 . . . VINMAX], there is the difficulty of obtaining an operational element capable of ensuring the linearity of the transfer over the entire range of variability of the signal (for example up to 0V). It should also be considered that in the case in which there is a single input and the buffer is always kept connected, at the start-up of the converter the input capacitance of the buffer is very high and must be charged at the input voltage, perturbing the signal source.

The problems presented by use of the buffer under voltage have been tackled, at least in the literature, by proposing the use of a device that comprises, in addition to the buffer under voltage, also a capacitive component intended to be connected to the source to be charged at the input voltage and, at a second moment, to be connected to the buffer so as to transfer the input voltage itself onto its output.

BRIEF SUMMARY

The steps of connection of the capacitive component to the source and, thereafter, to the buffer and vice-versa, should occur ensuring that the charge accumulated by the same capacitive component does not substantially vary and therefore, the source has an ideally zero switched equivalent capacitance.

It has been observed that this known buffer device, whilst being of great interest, does however have various limitations that actually reduce its performance and, consequently its use.

The present disclosure is to propose a buffer device, of the type that uses the aforementioned additional capacitive component, which has improved performance compared to that described previously.

In accordance with one embodiment of the present disclosure, an integrated buffer device for a switched capacitance circuit is provided. The device includes a buffer having an output for an output voltage dependent upon an input voltage that can be supplied by a source to the buffer device; a capacitive switching component that can be switched between a first and second condition in which it is connected, respectively, to the source to take on the input voltage and to the buffer to transfer onto the output the input voltage; the capacitive switching component provided with a terminal having an associated stray capacitance; and a charging and discharging device connected to the terminal and configured to pre-charge the stray capacitance on the capacitive switching component at a reference voltage before taking on the second condition, and to discharge the stray capacitance before taking on the first condition, keeping an electrical charge of the capacitive discharge component substantially constant in the first and second conditions.

In accordance with another aspect of the foregoing embodiment, the buffer devices includes an operational amplifier having a first input for the reference voltage and a second input. Ideally, the buffer has a first condition in which it is adapted to take on a reset configuration in which the output is connected to the second input of the operational amplifier and in which the output takes on substantially the reference voltage. In a second condition, the buffer is adapted to take on an operative configuration in which the capacitive switching component is connected between a node electrically connected to the second input and the output to transfer onto the output the input voltage in addition to the reference voltage.

In accordance with another aspect of the foregoing embodiment, the charging and discharging device includes a first switch connected between the terminal and a reference terminal to receive the reference voltage, the first switch adapted to be commanded to take up a closed state in which to charge the stray capacitance on the capacitive switching component and an open state in which the terminal is disconnected from the reference terminal, and wherein the charging and discharging device also includes a second switch connected to the terminal and to a ground terminal.

In accordance with another aspect of the foregoing embodiment, the second switch can be commanded to take up a closed state in which to discharge the stray capacitance on the capacitive switching component to the ground terminal and an open state in which the terminal is disconnected from the ground terminal.

In accordance with another embodiment of the present disclosure, an integrated electric circuit is provided that includes at least one source of an input voltage; a switched capacitance user circuit to receive the input voltage; and a buffer device coupled between the source and the user circuit, wherein the buffer device comprises: a buffer having an output for an output voltage dependent upon an input voltage that can be supplied by a source to the buffer device; a capacitive switching component that can be switched between a first and second condition in which it is connected, respectively, to the source to take on the input voltage and to the buffer to transfer onto the output the input voltage; the capacitive switching component provided with a terminal having an associated stray capacitance; and a charging and discharging device connected to the terminal and configured to pre-charge the stray capacitance on the capacitive switching component at a reference voltage before taking on the second condition, and to discharge the stray capacitance before taking on the first condition, keeping an electrical charge of the capacitive discharge component substantially constant in the first and second conditions.

In accordance with another embodiment of the present disclosure, a switched capacitance circuit is provided that includes a switching capacitor adapted to be coupled to a voltage source in a first condition to receive an input voltage and to be coupled to an output in a second condition to transfer the input voltage to the output, the switching capacitor having a stray capacitance associated with at least one terminal of the switching capacitor; and a circuit for charging and discharging the at least one terminal of the switching capacitor, comprising a first switch coupled to the at least one terminal and adapted to couple the switching capacitor to a reference terminal to precharge the at least one terminal to a reference voltage before taking on the second condition and a second switch coupled to the at least one terminal to couple the switching capacitor to a ground terminal to pre-discharge the stray capacitance before taking on the first condition.

In accordance with another aspect of the foregoing embodiment, the switched capacitance circuit includes a generator block that generates command signals to the first and second switches.

BRIEF DESCRIPTION OF THE SEVERAL VIEWS OF THE DRAWINGS

To better understand the disclosure and appreciate its advantages, some non-limiting example embodiments are described hereafter, with reference to the attached drawings, in which.

DETAILED DESCRIPTION

Circuit Description

Figure 1:
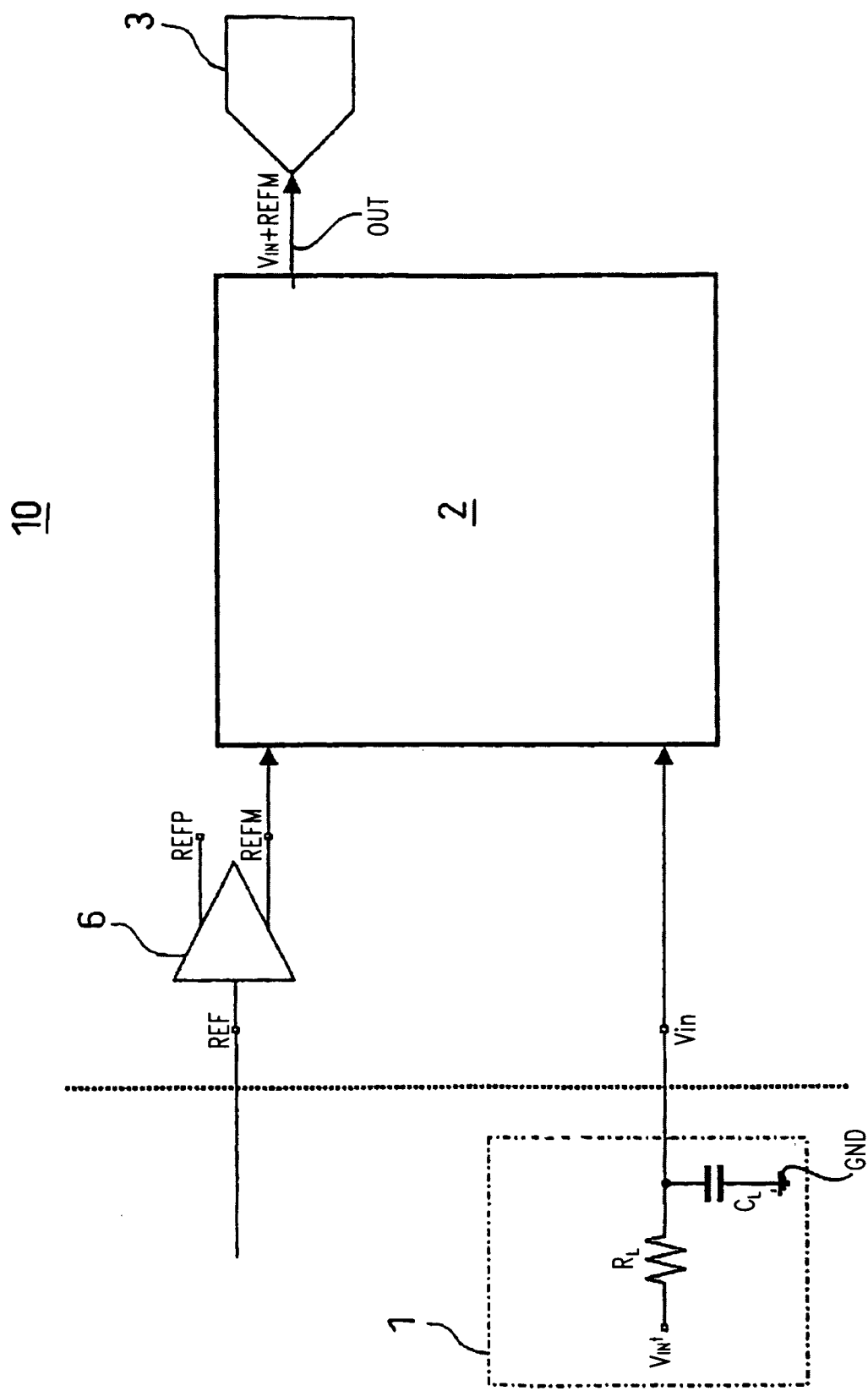
FIG. 1 schematically shows a circuit comprising a source, a buffer device and a user circuit.

FIG. 1 shows a diagram of an electric circuit 10 that includes at least one source 1 of an input voltage VIN, a buffer device 2, and a switched capacitance user circuit 3.

The source 1 is schematized in FIG. 1 with its own equivalent circuit that includes a terminal for a voltage VIN* (evaluated with respect to the ground GND) connected to an equivalent resistance $R_L$ having a terminal connected to an equivalent capacitance $C_L$, connected to ground and at the ends of which the generated voltage VIN is available.

According to the particular example shown in FIG. 1, the user circuit 3 is a conventional charge-sharing SAR (Successive Approximation Register) analogue-digital converter like, for example, the one described in patent application WO-A-2003-007479 (included here as reference). A detailed description of such a converter is provided in the aforementioned patent application with reference to FIG. 2 and with alternative embodiments described with reference to FIGS. 3, 4 and 5 of WO-A-2003-007479. In this specific case, the circuit 10 of FIG. 1 attached hereto also comprises a generic generator 6 that supplies reference voltages REFP and REFM that can be used by the converter 3 as term of comparison with the voltage stored on the capacities to carry out the conversion procedure for subsequent approximations. The same voltage REFM is also used as a voltage reference for the buffer device 2. In the specific example illustrated in FIG. 1, the voltage generator 6 exploits an external reference voltage REF, but such an implementation represents a non-limiting example.

It is important to observe that the present disclosure is also suitable for being applied to other switched capacitance user circuits different to the SAR analogue-digital converter, like, for example, switched capacitance filters, capacitive DACs (Digital Analogical Converters), sampling structures (like, for example, Sample&Hold structures).

In accordance with this example, the buffer device 2 is also a switched capacitance circuit and is such that the switched capacitance seen by the source 1 is made to be minimum and, advantageously, the total impedance seen by the same source is made to be maximum, so as to make the operation of the circuit 10 as close as possible to the ideal conditions.

As is clear to one skilled in the art, the effect of a switched capacitance on the source depends, as a consequence of a charge-sharing step, upon the variation in electrical charge carried on the equivalent (output) capacitance $C_L$ of the source 1.

In particular, if the source 1 sees a low charge variation in switching, then the switched capacitance can be defined as low.

Figure 2:
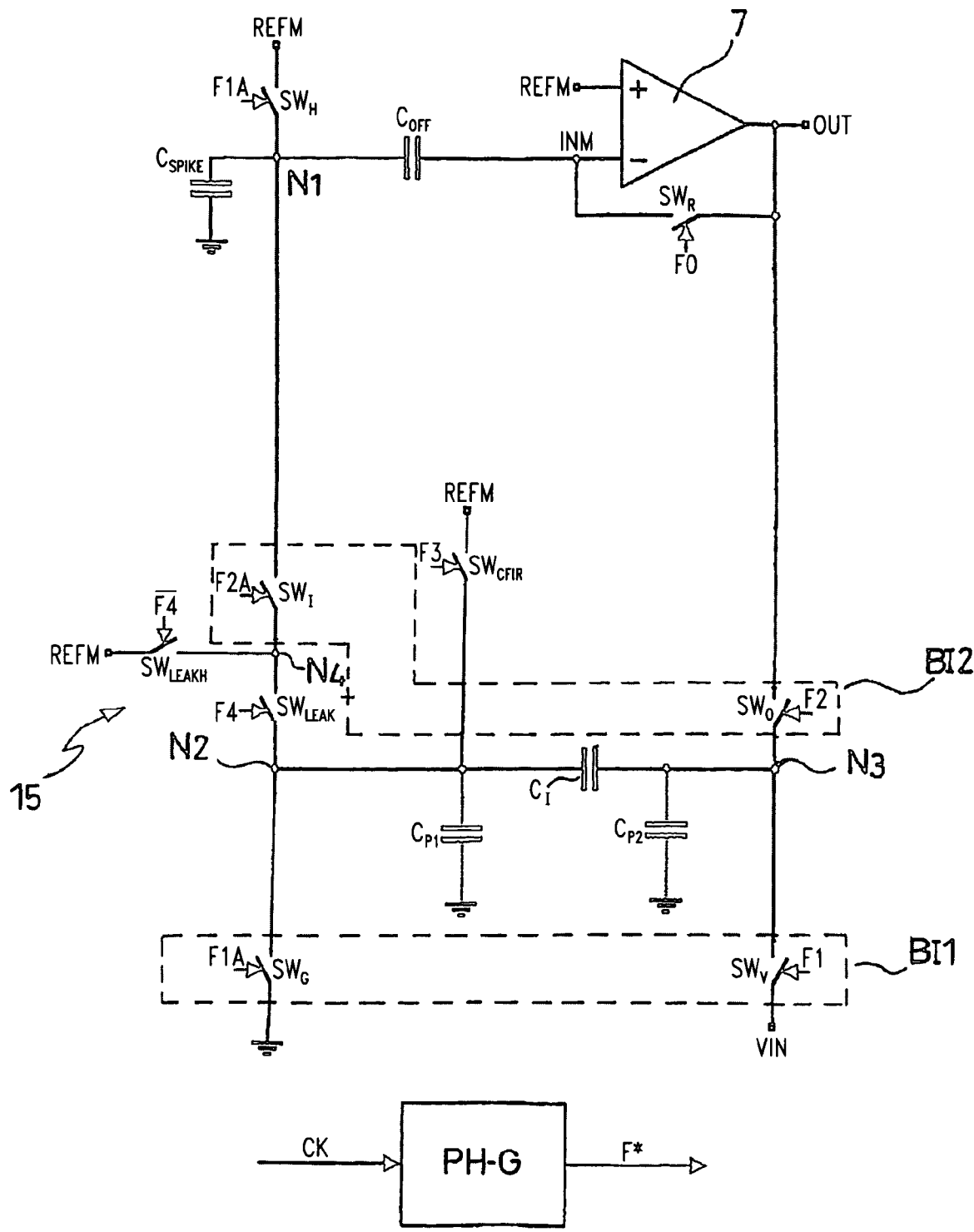
FIG. 2 shows a circuit diagram of a first embodiment of said buffer device.

With reference to FIG. 2 the circuit diagram of the buffer device 2 is shown, in accordance with a first example embodiment of the disclosure.

The buffer device 2 has a buffer 7, preferably an operational amplifier, having an output OUT for an output voltage of the device 2, a first (non-inverting) input REFM for the constant reference voltage REFM and a second (inverting) input INM. According to the example of FIG. 2, the output OUT of the buffer 7 can be connected to the second input INM through a first reset switch $SW_R$ that can be commanded by a respective signal F0.

The operational amplifier 7 can be made in MOSFET (Metal Oxide Semiconductor Field Effect Transistor) technology. Such an open loop operational amplifier 7 (i.e., switch $SW_R$ open) supplies in output an amplification (with suitable gain) of the difference between the signals present at the respective inputs and, moreover, has a very high input resistance. When the first reset switch $SW_R$ is closed (closed loop or reset configuration), the output OUT is connected to the second input INM.

Advantageously, the second input INM is connected to a capacitive compensation component $C_{OFF}$, having another end connected to a first node N1, the function of which is to reduce or, preferably, cancel out the offset voltage characteristic of the operational amplifier 7, in accordance with a per se known auto-zero procedure. The first node N1 can be connected through a second reset switch $SW_H$ also connected to the reference terminal REFM and commanded by a signal F1A, to supply said node with the reference voltage REFM when the operational amplifier 7 is in reset.

Moreover, the buffer device 2 is provided with a capacitive switching component $C_I$, which can be connected, in a first operative condition, to the source 1 to take on the input voltage VIN and, in a second operative condition, to the operational amplifier 7 to transfer onto the output OUT the input voltage VIN, in particular, in addition to the reference voltage REFM. The capacitive switching component $C_I$ can be switched between the two operative conditions defined above. In FIG. 2, the switching capacitor $C_I$ is connected between a second node N2 and a third node N3.

In greater detail, in the first operative condition, the switching capacitor $C_I$ is connected between the terminal of the source 1 that supplies the input voltage VIN and the ground GND. In the second operative condition, and taking the operational amplifier 7 into the configuration in which the first reset switch $SW_R$ is open, the switching capacitor $C_I$ is electrically connected between the first node N1 and the output OUT, feedbacking the operational amplifier 7.

The switching between the aforementioned operative conditions can be carried out through a first switch block BI1 (able to be commanded between a closed state and an open state) and connected, both to the ground terminal GND and to the terminal that supplies the input voltage VIN and also to the two nodes N2 and N3 of the switching capacitor $C_I$.

For example, the first switch block BI1 includes a first switch $SW_G$ (able to be commanded by a signal F1A) connected between the second node N2 of the switching capacitor $C_I$ and the ground GND and a second switch $SW_V$ (able to be commanded by a signal F1) connected between the third node N3 of the switching capacitor $C_I$ and the terminal of the source 1 at which the voltage VIN is available.

Moreover, the buffer device 2 includes a second switch block BI2 connected to the second node N2 and to the third node N3 of the switching capacitor $C_I$ and such as to take on an open state in which the capacitor is disconnected from the operational amplifier 7, and a closed state in which it is connected to the operational amplifier 7.

According to the example of FIG. 2, such a second switch block BI2 includes a third switch $SW_I$, able to be connected to the second node N2 of the switching capacitor $C_I$ and connected to said first node N1, and a fourth switch $SW_O$, connected between the third node N3 of the switching capacitor $C_I$ and the output OUT of the buffer device 2.

The first and the second reset switch $SW_R$ and $SW_H$, the first switch $SW_G$, the second switch $SW_V$, the third switch $SW_I$ and the fourth switch $SW_O$ can be made through conventional MOSFET technology.

It should be observed that the Applicant has found that the switching capacitor $C_I$ has a first stray capacitance $C_{P1}$ associated with its bottom plate and to the ground GND and a second stray capacitance $C_{P2}$ associated with its top plate and to the ground GND, both schematized in FIG. 2 with respective capacitors. The first stray is capacitance $C_{P1}$ connected between the second node N2 and the ground GND, and second stray capacitance $C_{P2}$ connected between the third node N3 and the ground GND.

As shall be made clearer later on, the switching capacitor $C_I$ does not substantially vary its charge during the various switching steps and is not therefore responsible for effects attributable to an actual switched capacitance, whereas the presence of stray capacitance negatively influences the operation of the buffer device 2 and of the entire circuit 10. In particular, the Applicant has found that the presence of the stray capacities leads to the existence of a switched capacitance contribution that is responsible for an error (gain) in the transfer of the signal and for a variation in the voltage on the capacitance $C_L$ of the source following a switching charge-sharing effect.

The buffer device 2 of FIG. 1 is equipped with a charging and discharging device, connected to the second node N2, and configured to charge (or pre-charge) the stray capacitance at a reference voltage REFM before the device 2 takes on the second operative condition, with the advantageous effect of substantially reducing the influence upon the output voltage by the stray capacitance.

Moreover, the charging and discharging device is such as to discharge (or pre-discharge) the stray capacitance, before the device 2 takes on the first condition, keeping an electric charge of the capacitive component substantially constant in said conditions.

In particular, the charging and discharging device includes a charging switch $SW_{CP1R}$ connected between the second node N2 and the terminal at which the reference voltage REFM is available. The charging switch $SW_{CP1R}$ can be commanded, through a signal F3, to take on a closed state in which to charge the first stray capacitance $C_{P1}$ and an open state in which the second node N2 is disconnected from the reference terminal REFM.

Moreover, the discharging function is carried out by a switch connected between the second node N2 and the ground GND that, for example, is the same first switch $SW_G$ already introduced. The first switch $SW_G$ can be commanded by the signal F1A to take up a closed state in which to discharge the stray capacitance $C_{P1}$ towards the ground terminal GND and an open state in which the second node N2 is disconnected from the ground terminal, together with the switching function of the connection of the switching capacitor $C_I$.

Advantageously, the buffer device 2 is also provided with an capacitive anchoring component $C_{SPIKE}$ (for example, a capacitor in MOS technology) connected between the first node N1 and the ground terminal GND and used to ensure adequate anchoring of the voltage of the first node N1 itself against the effects of the capacitive switching.

Moreover, preferably, the buffer device 2 comprises a loss reduction switch block 15. Such a block 15 comprises, for example, a fifth switch $SW_{LEAKH}$ (commanded by a signal F4) connected between the reference terminal REFM and a fourth node N4 arranged between the third switch $SW_I$ and the second node N2. Moreover, the block 15 comprises a sixth switch $SW_{LEAK}$ commanded by the signal F4 (of which the aforementioned signal $\overline{F4}$ is the logic negation) and connected between the fourth node N4 and the second node N2.

The command signals F*=F0, F1A, F2A, F1, F2 and F4 are generated by a suitable waveform generator PH-G, based upon a clock signal CK.

The described capacitive components, such as the switching capacitor $C_I$, the capacitive compensation component $C_{OFF}$, the capacitive stabilization component $C_{SPIKE}$, the capacitive attenuation component $C_{ATT}$ (described later on with reference to FIG. 5) can also be made in MOSFET technology.

Operation of the Circuit 10

The operation of the circuit 10 and in particular of the buffer device 2 shall now be described. For the sake of clarity, initially, the operation of the circuit shall be described leaving out the action of the charging switch $SW_{C1PR}$ and of the fifth switch $SW_{LEAKH}$ (which are assumed to be open) and of the sixth switch $SW_{LEAK}$ (which is assumed to be closed). Moreover, the capacitive stabilization component $C_{SPIKE}$, shall be considered not present.

Figure 3:
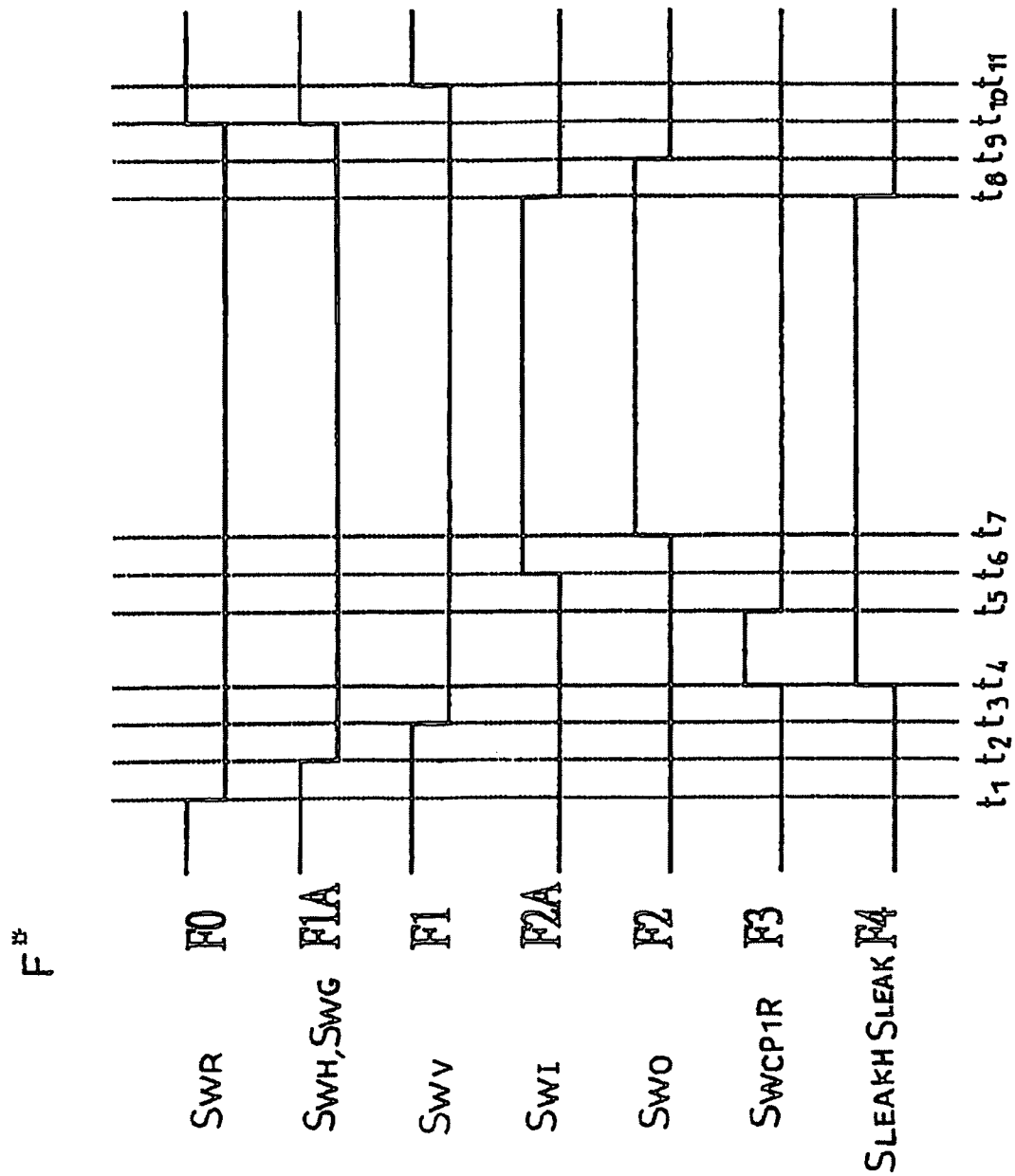
FIG. 3 shows an example of the progression of control signals that can be used by said buffer device.

The operation of the circuit 10 is described with reference to FIG. 3 in which the progressions of the command signals F* according to time are shown.

Before a conversion request (before t1), the first and the second reset switch $SW_R$ and $SW_H$ are in the closed state (F0 and F1A are high, so as to switch on the MOSFETs included in $SW_H$ and $SW_R$).

The operational amplifier 7 is in reset configuration (closed loop configuration), the first node N1 and the second input INM are forced at the reference voltage REFM.

Moreover, the third and the fourth switch $SW_1$ and $SW_0$ are open (signals F2A and F2 low), whereas the first and the second switch $SW_G$ and $SW_V$ are closed (signals F1A and F1 high). The third node N3 of the switching capacitor $C_I$ is connected to the terminal of the voltage VIN supplied by the source 1 and the second node N2 is connected to the ground terminal GND.

In this first operative condition, on the output OUT there is a voltage equal to REFM and at the ends of the switching capacitor $C_I$ there is the voltage VIN.

When a conversion request arrives, the first and the second reset switch $SW_R$ and $SW_H$ are taken into the open state by the relative command signals F0 and F1A (low at the instants t1 and t2). The first and the second switch $SW_G$ and $SW_V$ also open (t2 and t3) and the input voltage VIN remains stored in the switching capacitor $C_I$.

Advantageously, the command signals F1A and F1 are not synchronous, so that the opening of the first switch $SW_G$ (t2), connected to the ground terminal GND, anticipates the opening of the second switch $SW_V$ (t3). This has the advantage of allowing the switching capacitor $C_I$ to store a feedthrough independent from the input signal VIN. As known, the phenomenon of feedthrough is typical of switches in MOSFET technology and is linked to an injection of undesired charge that, in the present case engages the capacitors foreseen by the circuit (like the capacitor $C_I$). Advantageously, by activating (closing or opening) firstly the switch connected to a node at fixed voltage (for example, the ground voltage) and then the switch connected to the node at variable voltage (VIN), the injection of charge dependent upon the input signal VIN is avoided with consequent effects of non-linearity in the transfer of the buffer device 2.

Thereafter (instants t6 and t7; F2A and F2 high), the third and the fourth switch $SW_I$ and $SW_O$ close and the switching capacitor $C_I$ closes the feedback loop on the operational amplifier 7, connecting the output OUT with the first node N1 (second operative condition). The switching capacitor $C_I$ transfers the voltage VIN onto the output OUT, which is added to the reference voltage REFM. The voltage at the output OUT of the operational amplifier 7 is taken to the value REFM+VIN.

The conversion circuit 3, which is designed so as to manage an input signal that is translated into a known amount equal to REFM, can carry out the processing foreseen on the voltage REFM+VIN.

It should be observed that the translation of the input voltage VIN by an amount REFM is particularly advantageous, since it avoids the problem of non-linearity of the operational amplifier 7 that would occur for low input voltages VIN. The translation of the amount REFM ensures that the output OUT no longer has to reach ground due to a VIN equal to zero, and the output OUT shall reach REFM; this allows the performance of the operational element 7 to be relaxed that will therefore be substantially linear up to VIN equal to 0.

At the end of the charging step of the input voltage VIN by the converter 3, the third and the fourth switch $SW_I$ and $SW_O$ open (instants t8, t9, F2A and F2 reduce). Also in this case it should be noted that the fact that the third switch $SW_I$ opens earlier than the fourth switch $SW_O$ is preferable, since it is used to store in the capacitor $C_I$ a feedthrough independent from the value of the input voltage VIN.

Then the first and the second reset switch $SW_H$ and $SW_R$ close again (instant t10, F0 and F1A high) and the switching capacitor $C_I$ goes back to being connected between the ground terminal GND and the terminal VIN, i.e., it goes back into the first operative condition.

It is important to observe that without the feedthrough and non-ideal conditions, the capacitor $C_I$ would, in the transition from the second to the first operative condition, carry the same electrical charge that it had stored when it was connected to the source 1. This means that there would be no significant charge-sharing effect between the buffer device 2 described here and the equivalent capacitance $C_L$ of the source 1. The input voltage VIN would not therefore be perturbed by its reading: it is as if the buffer device 2 offers an extremely low switched input capacitance, tending towards zero.

Ideally:

$$VOUT(j)=VIN(j)+REFM \quad (1)$$

$$VIN(j+1)=VIN(j) \quad (2)$$

in which VOUT is the voltage on the output OUT and where the arguments indicate that the values of the voltages refer to a current buffering request j and subsequent buffering request j+1.

Consideration shall now be given to the first stray capacitance $C_{P1}$ and the second stray capacitance $C_{P2}$, introduced above.

It can be demonstrated, through charge calculations, that the stray capacities $C_{P1}$ and $C_{P2}$ at the two ends of the switching capacitor $C_I$ influence the switched capacitance seen by the source 1 and determine both an error in the transfer in output VOUT, and a variation by a charge-sharing at the ends of the capacitance of the source 1.

Indeed, the output voltage VOUT from the buffer device 2 is:

$$VOUT(j) = VIN(j) + \left[1 + \frac{C_{P1}}{C_I}\right] \cdot REFM \quad (3)$$

and the voltage at the ends of the output capacitance at the source 1, in the step J+1, is:

$$VIN(j+1) = VIN(j) + \left[\frac{C_{P1} + C_{P2} + \frac{C_{P1} \cdot C_{P2}}{C_I}}{C_I + C_{P2} + C_L}\right] \cdot REFM \quad (4)$$

The value of the second stray capacitance $C_{P2}$ can usually be ignored, since it can be limited with suitable layout choices. On the other hand, the effect of the first stray capacitance $C_{P1}$ is low, in accordance with an embodiment of the disclosure, thanks to the use of the charging and discharging device introduced above and, in particular, thanks to the presence and to the command modes of the charging switch $SW_{CP1R}$ and of the first switch $SW_G$.

In particular, the method described above is modified so as to foresee that, after having opened the first and the second switch $SW_G$ and $SW_V$ (instants t2 and t3), but before connecting the switching capacitor $C_I$ to the operational amplifier 7 (through the closing of the third and fourth switch $SW_I$ and $SW_O$ in the instants t6 and t7), the charging switch $SW_{CP1R}$ is closed (instant t4, signal F3 switches upwards). In this way the first stray capacitance $C_{P1}$ is pre-charged at the reference voltage REFM, the same voltage that it shall take on once the switching capacitor $C_I$ shall be connected to the operational amplifier 7.

Thus, in the transition from the first operative condition (connection to the source 1) to the second operative condition (connection to the operational amplifier 7), the second stray capacitance $C_{P1}$ must not vary its charge and, consequently, it will not have an effect on the balance of the charges. It follows from this that the voltage VOUT at the output of the buffer device 2 is again expressed, substantially, by the ideal relationship (1), illustrated previously, and not by relationship (3).

It should be noted that, advantageously, to improve the reduction of the effect of the first stray capacitance $C_{P1}$, the third switch $SW_I$ is closed (instant t6) earlier than the closing (instant t7) of the fourth switch $SW_O$, in order to make the effects of the feedthrough associated with such switches less harmful.

Moreover, the negative effect due to the first stray capacitance $C_{P1}$ is substantially eliminated (or at least greatly limited) also in terms of the perturbation introduced upon the voltage of the source 1 when the switching capacitance $C_I$ is taken back into the initial condition (i.e., connected to the source 1 itself).

Indeed, according to an example in accordance with the present disclosure, before taking the switching capacitor $C_I$ back into the first operative condition, in which it is connected to the source 1, the second stray capacitance $C_{P1}$ is discharged towards ground GND. In particular, this is obtained by closing the first switch $SW_G$ (signal F1A, instant t10) in advance of (i.e., before) the closing of the second switch $SW_V$ (signal F1, instant t11).

In this way the first stray capacitance $C_{P1}$ is discharged to ground, thus taking it into the condition that it shall have once reconnected to the source 1. Since its charge does not have to be varied, the first capacitance $C_{P1}$ shall not intervene in the balance of charges and the expression of the voltage shown at the source 1 VIN(j+1) is substantially that of the ideal relationship (2) (ignoring the second stray capacitance $C_{P2}$) and not that of relationship (4).

Further Embodiments

Hereafter particular embodiments of the disclosure shall be discussed. It should be noted that in the following figures the same reference numerals shall be used to indicate electrical components, functional blocks, switches, terminals, signals or nodes that are identical or analogous to those already described.

For example, the capacitive compensation component $C_{OFF}$ stores the offset of the operational amplifier 7 so as to cancel out its effect on the output OUT. Therefore, the buffer device 2 is very reliable since it shall have, as undesired offset on the output OUT, almost exclusively the offset due to the feedthrough phenomena of the switches used.

Another preferred aspect of the disclosure is that associated with the use of the capacitive stabilization component $C_{SPIKE}$ (FIG. 2).

The capacitive stabilization component $C_{SPIKE}$ allows the "spikes" associated with the switching of the capacitive components used in the buffer device 2 to be limited, since it anchors the voltage of the first node N1, avoiding the potential of such a node being able, even momentarily and due to capacitive switching, to fall below the ground reference GND. Such an eventuality would result in the joints of the switches connected to such a node towards the substrate switching on and consequently current leakage would occur that would compromise the performance of the transfer. It should be observed that it is possible to demonstrate that this capacitive stabilization component $C_{SPIKE}$ does not alter the charge balances considered previously.

Figure 4:
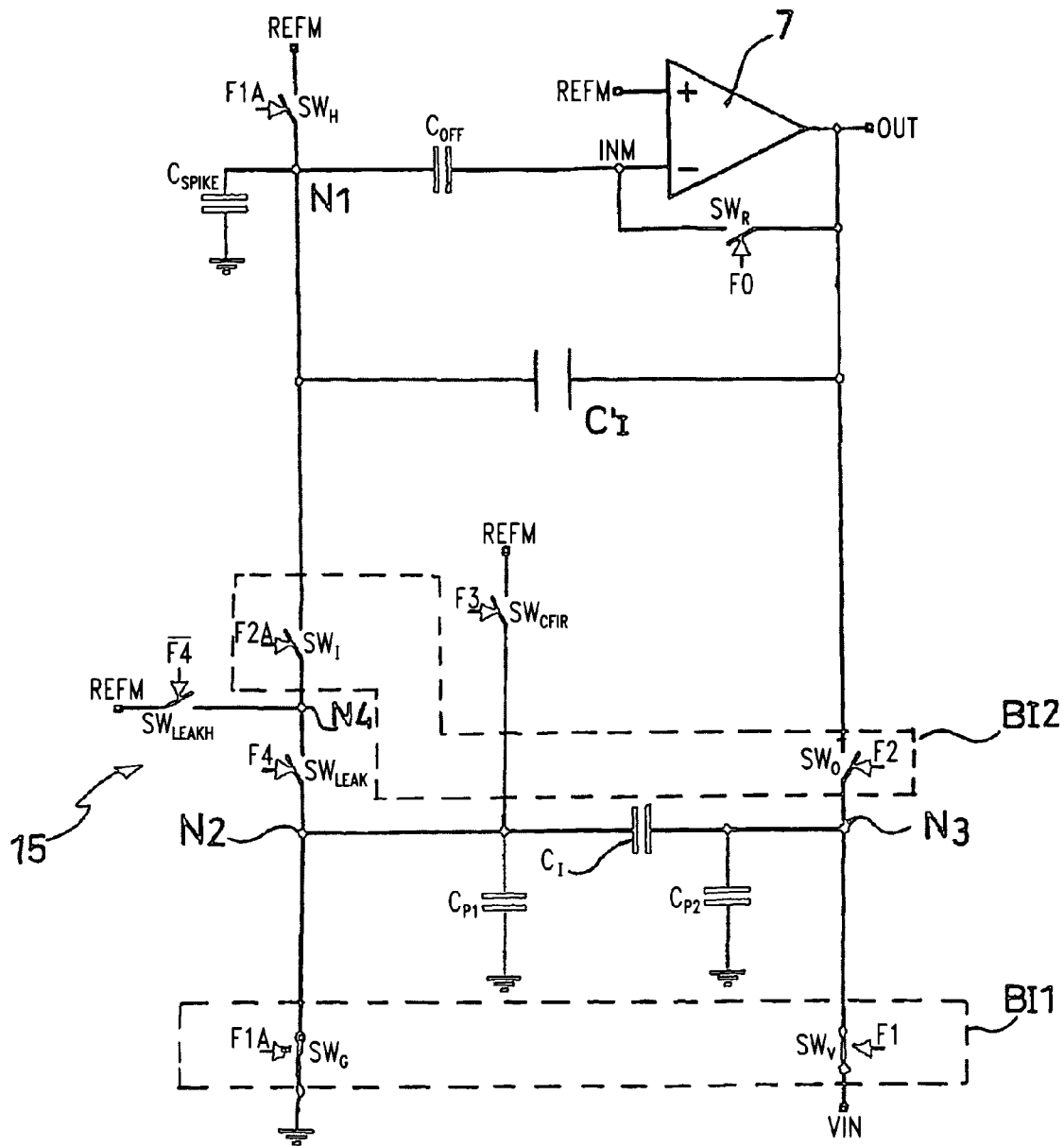
FIG. 4 shows a circuit diagram of a second embodiment of said buffer device suitable for handling many inputs.
Figure 4:
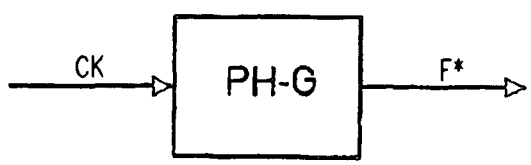

FIG. 4 refers to the case in which the buffer device 2 is used in a circuit 10 such as to manage the conversion of many inputs and not only that of the voltage VIN shown.

In this case, the buffer device 2 includes, for example, at least one additional capacitive switching component $C_I'$ (of suitable capacitance) selectionable for a specific input. Each of the additional capacitors $C_I'$ also has further switches associated with it (not shown in FIG. 4, for the sake of simplicity) analogous to those of the first switch block BI1, of the second switch block B12 and of the charging and discharging device that comprises, in the example, the first switch $SW_G$ and the charging switch $SW_{CP1R}$.

In the case in which there are many inputs to convert, numerous switches with analogous functions to the third switch $SW_I$ shall be connected onto the first node N1 (which is a high-impedance node).

With reference to FIG. 4, it is presumed that the additional capacitor $C_I'$ is connected to the operational amplifier 7 (through closing of the respective switches, not shown) whereas the switching capacitor $C_I$ is not selected. In this case, as can be seen in FIG. 4, the third switch $SW_I$ is open and is with a respective terminal at the reference voltage REFM (first node N1) and with the other terminal (the one connected to the fourth node N4) that is, in turn, able to be connected to the ground GND through the first switch $SW_G$.

In this situation, a leakage current could cross this third switch $SW_I$ towards the ground GND and could be so high (above all as the number of inputs to convert increases, as the temperature increases and to an increasingly marked extent in current technologies in which there is a progressive reduction in the threshold voltages of the MOS devices) as to substantially vary the electrical charge stored in the additional capacitor $C_I'$. It should be observed that the first switch $SW_G$ of FIG. 4 is closed, in this situation.

With reference to this problem, the aforementioned loss reduction switch block 15, with which the device 2 is preferably provided, plays a very advantageous role.

Indeed, the fifth switch $SW_{LEAKH}$ and the sixth switch $SW_{LEAK}$, commanded by the signal F4, are closed within the range t5-t8 (i.e., during the period in which the connection to the operational amplifier 7 of the additional capacitor $C_I'$ takes place). In this way, the terminal connected to the fourth node N4 of the third switch $SW_I$ is also taken to the reference voltage REFM, drastically reducing its losses to ground.

It should be observed that, with reference to the explanation illustrated previously, the fifth switch $SW_{LEAKH}$ and the sixth switch $SW_{LEAK}$ (of FIG. 3) switched from the signal F4 (with the progression of FIG. 3) do not perturb the normal operation of the buffer device 2.

In the example embodiments described above, it has implicitly been assumed that one wishes to transfer onto the output OUT the input signal VIN only translated by an amount REFM. Advantageously, in accordance with a preferred example embodiment of the disclosure described with reference to FIG. 5, it is also possible to manage an attenuation of the input voltage VIN.

Figure 5:
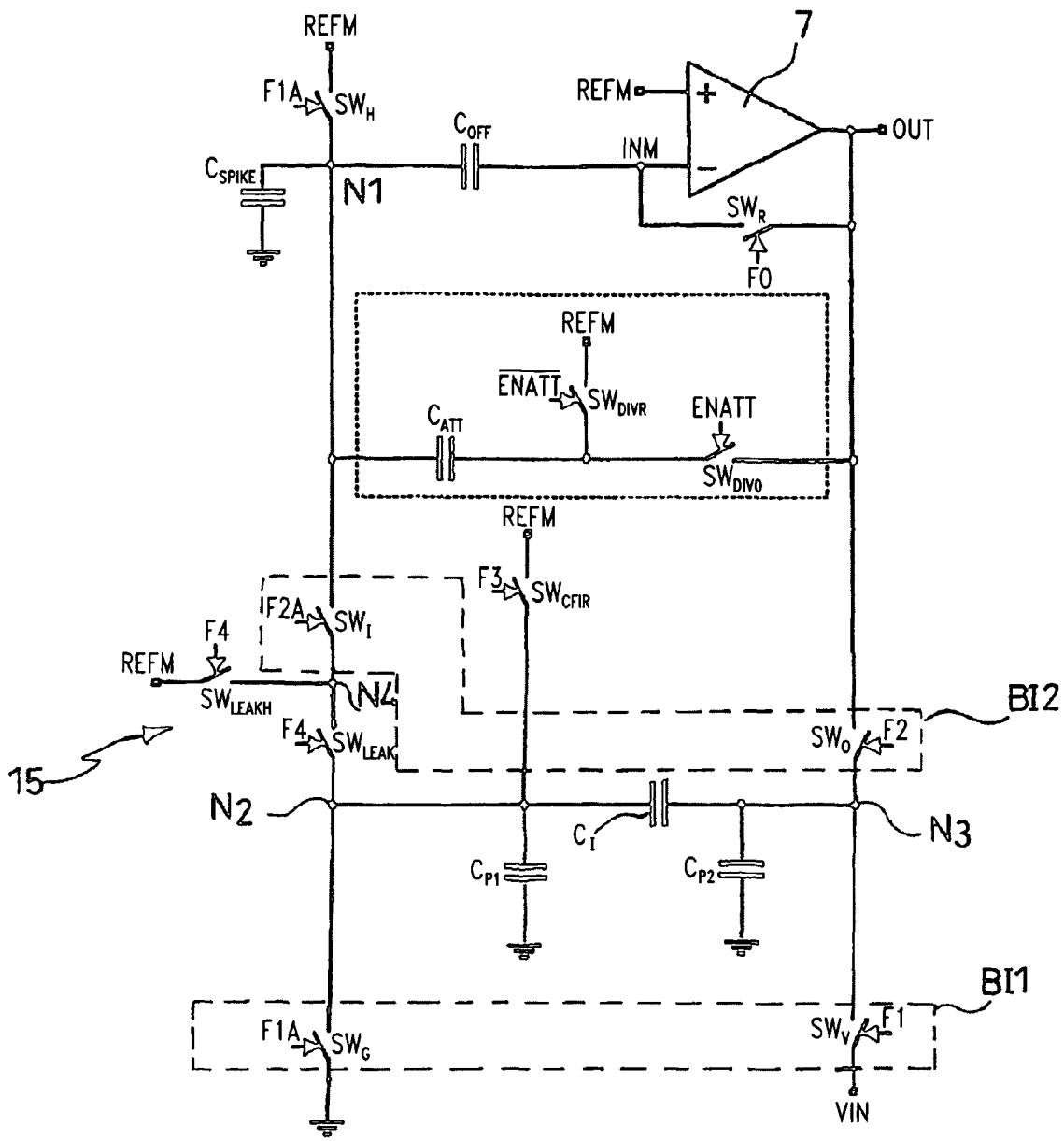
FIG. 5 shows a circuit diagram of a third embodiment of said buffer device comprising an attenuation block.

Regarding this, the buffer device 2 according to the example of FIG. 5 is provided with a capacitive attenuation component $C_{ATT}$ able to be electrically connected in parallel to the capacitive switching component $C_I$. The capacitive attenuation component $C_{ATT}$ can be enabled/disabled through a first selection switch $SW_{DIV0}$ (commanded by a signal ENATT) and by a second selection switch $SW_{DIVR}$ (commanded by a conjugated signal of the signal ENATT). In particular, when one wishes to apply the attenuation, the capacitive attenuation component $C_{ATT}$ is connected to the operational amplifier 7 opening the second selection switch $SW_{DIVR}$, and closing the first selection switch $SW_{DIV0}$.

In the second operative condition, the output voltage VOUT is:

$$VOUT(j) = \frac{C_I}{C_I + C_{ATT}} \cdot VIN(j) + REFM \qquad (5)$$

Therefore, the output voltage VOUT is attenuated with respect to the value REFM+VIN.

The solution described with reference to FIG. 5 is particularly advantageous in applications for cellular telephony, in which the analogue-digital converter 3 is used to convert both signals with a range within a precise analogue supply, and signals with a range that exceeds such a supply (in any case remaining less than the less accurate and precise battery voltage).

The solution of FIG. 5, through the attenuation, allows input signals VIN with a range greater than the analogue voltage to be received, but designing the operational element under this (more suitable) supply, suitably configuring the supply of the switches that transfer the input voltage.

It should be observed that according to the solutions of the prior designs mentioned earlier, to manage signals with a range greater than the analogue supply, it was necessary to supply the structures at the battery voltage.

Moreover, in the case of conversion of a plurality of inputs (as described with reference to FIG. 4) a different capacitive attenuation component $C_{ATT}$ shall be used for each different attenuation factor that one wishes to introduce.

It is necessary to note that in the case in which an attenuation factor with the capacitance $C_{ATT}$ is made, the perturbation displayed on the source 1 is greater than the case without attenuation. With the use of the capacitive attenuation component $C_{ATT}$, the switching capacitor $C_I$, when reconnecting to the source 1, has a smaller charge with respect to that initially taken: the result of this is an equivalent capacitance different from zero (equal to a fraction of the capacitance associated with the capacitor $C_I$ of increasing magnitude the greater the attenuation that one wishes to carry out).

It should be repeated that, although exclusive reference has been made to the specific application of an analogue-digital converter, the proposed solution can be applied in any circuit in which it is necessary to make a buffer of an analogue signal, ensuring a low switched input capacitance and, for example, also the linearity of the transfer over the entire range of the signal itself.

Advantages

The solution in accordance with the present disclosure has numerous advantages.

The use of the charging and discharging device (like the one made, for example, with the charging switch $SW_{CP1R}$ and the first switch $SW_G$) allows the switched capacitance seen by the source 1 to be reduced, limiting the effects of the stray capacitance.

Moreover, such a charging and discharging device allows a value of the voltage in output at the buffer device to be obtained that is not perturbed by the presence of the stray capacitance.

Moreover, the possibility of carrying out a translation of the input voltage VIN of the reference voltage REFM allows substantially linear behavior of the buffer device to be obtained even for very low input voltages VIN.

Other advantages, already described, are linked to the use of the capacitive compensation components $C_{OFF}$, capacitive stabilization components $C_{SPIKE}$ and capacitive attenuation components $C_{ATT}$ as well as to the use of the loss reduction block 15 and to the particular timing of the signals F* that has beneficial effects against the phenomenon of feedthrough of the MOSFETs that make the switches used.

Therefore, with reference to the particular solutions described and shown in the figures, the teachings provided allow input signals of the [0 ... VINMAX] type to be buffered, ensuring their linearity of transfer in the entire range, offering an equivalent input impedance of the purely capacitive type with an extremely low capacitance value, and introducing very limited offset and gain errors.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated buffer device for a switched capacitance circuit, comprising:
    a buffer having an output for an output voltage dependent upon an input voltage that can be supplied by a source to the buffer device;
    a capacitive switching component that can be switched between a first and second condition in which it is connected, respectively, to the source to take on the input voltage and to the buffer to transfer onto the output the input voltage; the capacitive switching component provided with a terminal having an associated stray capacitance; and
    a charging and discharging device connected to the terminal and configured to pre-charge the stray capacitance on the capacitive switching component at a reference voltage before taking on the second condition, and to pre-discharge the stray capacitance before taking on the first condition, keeping an electrical charge of the capacitive discharge component substantially constant in the first and second conditions.

2. The buffer device of claim 1, comprising an operational amplifier having a first input for the reference voltage and a second input.

3. The buffer device of claim 2, wherein the buffer, in the first condition, is adapted to take on a reset configuration in which the output is connected to the second input of the operational amplifier and in which the output takes on substantially the reference voltage.

4. The buffer device of claim 3, wherein the buffer, in the second condition, is adapted to take on an operative configuration in which the capacitive switching component is connected between a node electrically connected to the second input and the output to transfer onto the output the input voltage in addition to the reference voltage.

5. The buffer device of claim 1, wherein the charging and discharging device comprises a first switch connected between the terminal and a reference terminal to receive the reference voltage.

6. The buffer device of claim 5, wherein the first switch is adapted to be commanded to take up a closed state in which to charge the stray capacitance on the capacitive switching component and an open state in which the terminal is disconnected from the reference terminal.

7. The buffer device of claim 5, wherein said charging and discharging device also comprises a second switch connected to said terminal and to a ground terminal.

8. The buffer device of claim 7, wherein said second switch can be commanded to take up a closed state in which to discharge the stray capacitance on the capacitive switching component to the ground terminal and an open state in which said terminal is disconnected from the ground terminal.

9. The buffer device of claim 1, further comprising a first switch block connected between said terminal, a further terminal of the capacitive switching component, and the ground terminal and the source of the input voltage; the first switch block adapted to be commanded to take up, in the first condition, a closed state in which the capacitive switching component is connected to said source and to the ground terminal to take up the input voltage and, in the second condition, an open state in which it is disconnected from the source and from the ground terminal.

10. The buffer device of claim 9, wherein the first switch block comprises said second switch and a third switch connected between the further terminal of the capacitive switching component and a terminal of said source that provides the input voltage.

11. The buffer device of claim 9, further comprising a second switch block connected to said terminal, to the further terminal of the capacitive switching component, and to said buffer; the second switch block, in the first condition, taking up an open state in which the capacitive switching component is disconnected from the buffer, and in the second condition, a closed state in which it is connected to the buffer.

12. The buffer device of claim 11, wherein said second switch block comprises:
    a fourth switch connected between the further terminal of the capacitive switching component and the output of the buffer;
    a fifth switch connected between the terminal of the capacitive switching component and the node connected to the second input.

13. The buffer device of claim 12, further comprising:
    a sixth switch connected between the node and the reference terminal to supply the node with the reference voltage in the reset configuration;
    a seventh switch connected between the second input and the output and able to be commanded to close and supply said output with the reference voltage in the reset configuration and to open, in the operative configuration.

14. The buffer device of claim 13, further comprising a capacitive compensation component connected between the second input and the node; said capacitive compensation component adapted, in the reset configuration, to take on an offset voltage characteristic of the buffer and to reduce such an offset voltage in the operative configuration.

15. The buffer device of claim 13, further comprising a voltage anchoring capacitive component connected to the node and to a respective ground terminal.

16. The buffer device of claim 12, further comprising a switch block adapted to connect a terminal that can be connected to ground of the fifth switch, when in open state, to a further terminal that provides the reference voltage so as to reduce a leakage current effect of the fifth switch to ground.

17. The buffer device of claim 1, further comprising a capacitive attenuation component adapted to be electrically connected in parallel to the capacitive switching component and to carry out, in the second condition, a charge exchange with the capacitive switching component so as to transfer a lower voltage than the input voltage to the output terminal.

18. The buffer device of claim 15, further comprising a generator block of command signals of the charging and discharging device and of said switches.

19. The buffer device of claim 1, comprising at least one further capacitive switching component and at least one further charging and discharging device to be associated with at least one other source of a respective input voltage.

20. The buffer device of claim 18, wherein said generator block of command signals is such that in the switching from the first to the second condition, it commands the closing of the fifth switch before the closing of the fourth switch.

21. The buffer device of claim 1, wherein the buffer device is made in MOSFET technology.

22. An integrated electric circuit comprising:
  at least one source of an input voltage;
  a switched capacitance user circuit to receive the input voltage; and
  a buffer device coupled between the source and the user circuit, wherein the buffer device comprises:
    a buffer having an output for an output voltage dependent upon the input voltage supplied by the source to the buffer device;
    a capacitive switching component that can be switched between a first and second condition in which it is connected, respectively, to the source to take on the input voltage and to the buffer to transfer onto the output the input voltage; the capacitive switching component provided with a terminal having an associated stray capacitance; and
    a charging and discharging device connected to the terminal and configured to pre-charge the stray capacitance on the capacitive switching component at a reference voltage before taking on the second condition, and to discharge the stray capacitance before taking on the first condition, keeping an electrical charge of the capacitive discharge component substantially constant in the first and second conditions.

23. The electric circuit of claim 22, wherein said switched capacitance user circuit comprises an SAR charge-sharing analogue-digital converter.

24. A switched capacitance circuit, comprising:
  a switching capacitor adapted to be coupled to a voltage source in a first condition to receive an input voltage and to be coupled to an output in a second condition to transfer the input voltage to the output, the switching capacitor having a stray capacitance associated with at least one terminal of the switching capacitor; and
  a circuit for charging and discharging the at least one terminal of the switching capacitor, comprising a first switch coupled to the at least one terminal and adapted to couple the switching capacitor to a reference terminal to precharge the at least one terminal to a reference voltage before taking on the second condition and a second switch coupled to the at least one terminal to couple the switching capacitor to a ground terminal to pre-discharge the stray capacitance before taking on the first condition.

25. The switched capacitance circuit of claim 24, further comprising a generator block that generates command signals to the first and second switches.

26. The switched capacitance circuit of claim 24, comprising at least one further capacitive switching component and at least one further charging and discharging device to be associated with at least one other source of a respective input voltage.

* * * * *